United States Patent
Umeda et al.

(10) Patent No.: US 12,322,562 B2
(45) Date of Patent: Jun. 3, 2025

(54) PROTECTIVE DEVICE, ENERGY STORAGE APPARATUS, AND METHOD FOR REDUCING CONTACT RESISTANCE OF RELAY

(71) Applicant: GS Yuasa International Ltd., Kyoto (JP)

(72) Inventors: Akihito Umeda, Kyoto (JP); Takeyuki Shiraishi, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 396 days.

(21) Appl. No.: 17/641,738

(22) PCT Filed: Aug. 18, 2020

(86) PCT No.: PCT/JP2020/031048
§ 371 (c)(1),
(2) Date: Mar. 9, 2022

(87) PCT Pub. No.: WO2021/039482
PCT Pub. Date: Mar. 4, 2021

(65) Prior Publication Data
US 2022/0301795 A1     Sep. 22, 2022

(30) Foreign Application Priority Data

Aug. 28, 2019 (JP) .................................. 2019-155690

(51) Int. Cl.
*H01H 47/00* (2006.01)
*G01R 31/327* (2006.01)
*H01H 47/22* (2006.01)

(52) U.S. Cl.
CPC ....... *H01H 47/002* (2013.01); *G01R 31/3274* (2013.01); *H01H 47/22* (2013.01)

(58) Field of Classification Search
CPC ... G01R 31/3274; H01H 47/002; H01H 47/22
See application file for complete search history.

(56) References Cited

U.S. PATENT DOCUMENTS

| | | | |
|---|---|---|---|
| 10,677,846 B2 * | 6/2020 | Guziak | H01H 9/542 |
| 2004/0189307 A1 * | 9/2004 | Rudholm | G01R 31/3274 324/421 |
| 2009/0055052 A1 | 2/2009 | You | |
| 2013/0096853 A1 * | 4/2013 | Mahalingam | G01R 31/3274 702/58 |

(Continued)

FOREIGN PATENT DOCUMENTS

| | | | |
|---|---|---|---|
| JP | H01-150332 U | 10/1989 | |
| JP | 2000-090796 A | 3/2000 | |

(Continued)

OTHER PUBLICATIONS

International Search Report (ISR) (PCT Form PCT/ISA/210), in PCT/JP2020/031048, dated Oct. 27, 2020.

*Primary Examiner* — Scott Bauer
(74) *Attorney, Agent, or Firm* — McGinn IP Law Group, PLLC

(57) ABSTRACT

A protective device includes a relay having a contact that opens and closes a current path of a cell, and a control device that controls the relay. The control device executes a reduction processing of reducing a contact resistance of the relay.

20 Claims, 9 Drawing Sheets

(56) References Cited

U.S. PATENT DOCUMENTS

| | | | |
|---|---|---|---|
| 2013/0300424 A1* | 11/2013 | Klapper | G01R 27/20 324/424 |
| 2013/0325303 A1 | 12/2013 | Kiuchi | |
| 2014/0002945 A1* | 1/2014 | Kodama | H01H 47/002 361/160 |
| 2016/0134224 A1* | 5/2016 | Bock | H01H 89/00 318/473 |
| 2016/0169945 A1* | 6/2016 | Mauder | G01R 31/3274 324/126 |
| 2017/0045586 A1 | 2/2017 | Kiuchi | |
| 2017/0057376 A1 | 3/2017 | Murata | |
| 2017/0115681 A1 | 4/2017 | Fujimoto | |
| 2017/0151876 A1 | 6/2017 | Kinoshita | |
| 2018/0238968 A1 | 8/2018 | Wada et al. | |
| 2020/0130614 A1 | 4/2020 | Toyoizumi et al. | |

FOREIGN PATENT DOCUMENTS

| | | |
|---|---|---|
| JP | 2005-253156 A | 9/2005 |
| JP | 2007-026992 A | 2/2007 |
| JP | 2009-046111 A | 3/2009 |
| JP | 2013-250157 A | 12/2013 |
| JP | 2015-159633 A | 9/2015 |
| JP | 2016-080351 A | 5/2016 |
| JP | 2017-084561 A | 5/2017 |
| JP | 2017-100521 A | 6/2017 |
| JP | 2018-136314 A | 8/2018 |
| JP | 2020-071934 A | 5/2020 |

\* cited by examiner

PROTECTIVE DEVICE, ENERGY STORAGE APPARATUS, AND METHOD FOR REDUCING CONTACT RESISTANCE OF RELAY

TECHNICAL FIELD

The present invention relates to a technique for suppressing a resistance loss in a relay.

BACKGROUND ART

One of protective devices for an energy storage device is a relay. The relay is disposed in a current path of the energy storage device, and cuts off a current at the time of abnormality to protect the energy storage device.

PRIOR ART DOCUMENT

Patent Document

Patent Document 1: JP-A 2018-136314

DISCLOSURE OF THE INVENTION

Problems to be Solved by the Invention

When the CLOSE state of the relay continues for a long period of time, a contact resistance may increase due to an oxidized surface film formed on a contact. As the contact resistance increases, a resistance loss in the relay increases.

It is an object of the present invention to suppress the resistance loss in the relay.

Means for Solving the Problems

A protective device includes a relay having a contact that opens and closes a current path of an energy storage device, and a control device that controls the relay. The control device executes a reduction processing of reducing a contact resistance of the relay.

The present technique can be applied to an energy storage apparatus, and can also be applied to a method for reducing the contact resistance of a relay.

Advantages of the Invention

The present technique can suppress an increase in a contact resistance to reduce a resistance loss in a relay.

MODE FOR CARRYING OUT THE INVENTION

A protective device includes a relay having a contact that opens and closes a current path of a cell, and a control device that controls the relay. The control device executes a reduction processing of reducing a contact resistance of the relay. By reducing the contact resistance, a resistance loss in the relay can be suppressed.

The reduction processing may be a processing of successively opening and closing the contact a plurality of times. An oxidized surface film of the contact can be broken by opening and closing the contact. When the contact is successively opened and closed a plurality of times, the breakdown of the oxidized surface film proceeds as compared with the case where the contact is opened and closed only once, whereby the effect of reducing the contact resistance is large.

The reduction processing may be a processing of energizing the relay. The oxidized surface film can be broken by energizing the relay to cause a current to flow through the contact. This processing has an advantage that the contact resistance can be reduced without opening a current path.

The control device may execute the reduction processing when a current of the cell is equal to or less than a predetermined value and the CLOSE state of the contact continues for a predetermined period. Under such conditions, the oxidized surface film is easily formed, whereby the contact resistance can be effectively reduced.

The cell may be used for a vehicle, and the control device may execute the reduction processing during parking. During parking, the discharge current of the cell is minute, whereby the oxidized surface film of the contact is not broken, which is apt to cause an increase in the contact resistance. By performing the reduction processing during parking, the contact resistance that increases during parking can be reduced.

The cell may be used for engine startup. The resistance loss in the relay is suppressed, which makes it possible to suppress the occurrence of a problem that an engine cannot be started under a condition where engine startability is deteriorated, such as a low temperature environment or a low SOC.

First Embodiment

1. Description of Structure of Battery 50

Figure 1:
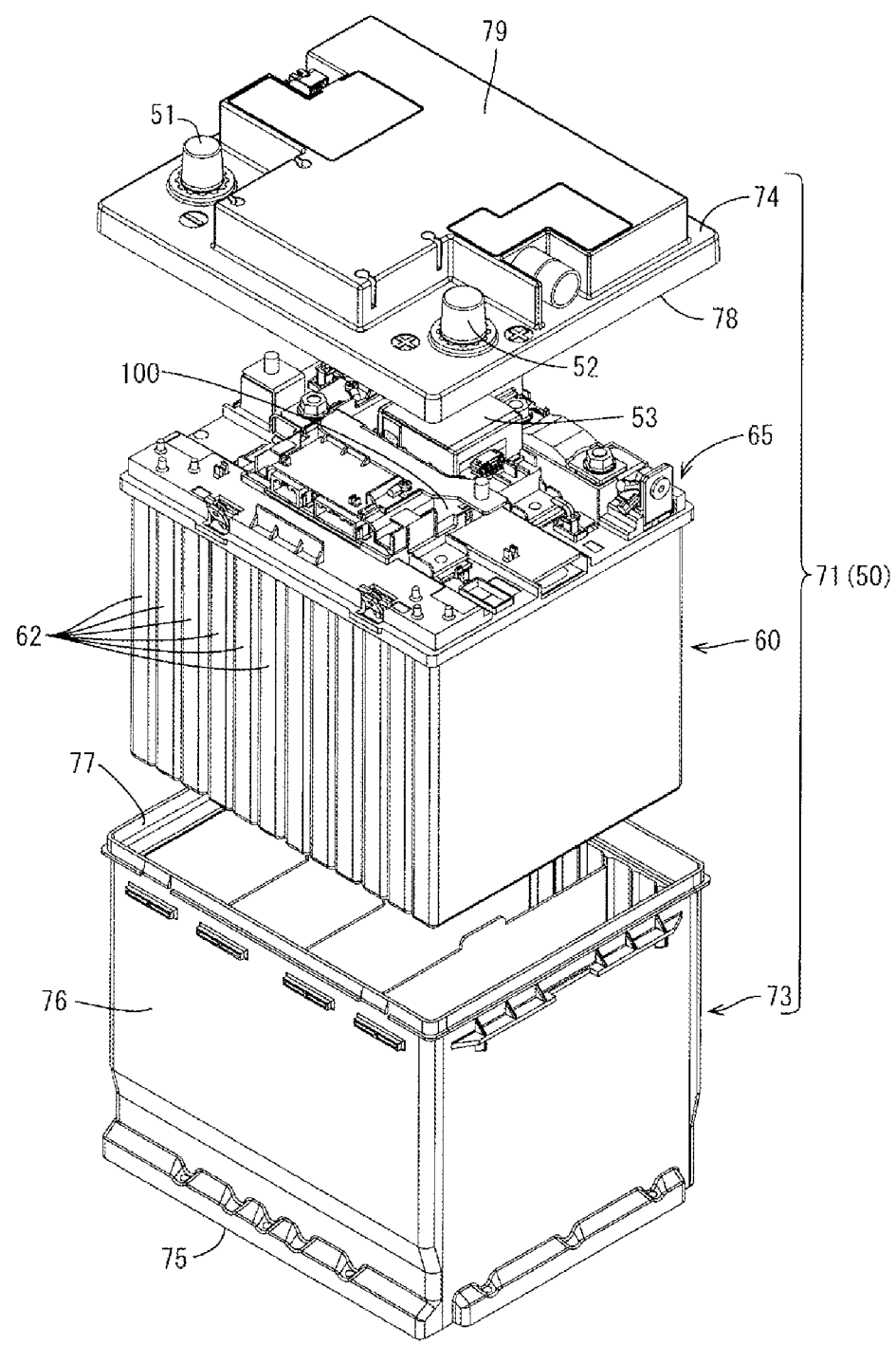
FIG. 1 is an exploded perspective view of a battery.

As illustrated in FIG. 1, a battery 50 includes an assembled battery 60, a control board 65, and a housing 71. The battery 50 is an example of an energy storage apparatus.

The housing 71 includes a main body 73 made of a synthetic resin material and a lid body 74. The main body 73 has a bottomed tubular shape. The main body 73 includes a bottom surface portion 75 and four side surface portions 76. An upper opening portion 77 is formed in an upper-end portion by the four side surface portions 76.

The housing 71 houses the assembled battery 60 and the control board 65. The assembled battery 60 has twelve cells 62. The cell 62 may be a lithium ion secondary battery (hereinafter, referred to as "battery cell"). The lithium ion secondary battery may be an iron phosphate-based battery containing lithium iron phosphate (LiFePO$_4$) as a positive active material and graphite as a negative active material.

In the present embodiment, the twelve battery cells 62 are connected in three-parallel and four-series. The control board 65 is disposed above the assembled battery 60.

The lid body 74 closes the upper opening portion 77 of the main body 73. An outer peripheral wall 78 is provided around the lid body 74. The lid body 74 has a protrusion 79 having a substantially T-shape in plan view. An external terminal 51 of a positive electrode is fixed to one corner of the front portion of the lid body 74, and an external terminal 52 of a negative electrode is fixed to the other corner.

Figure 2:
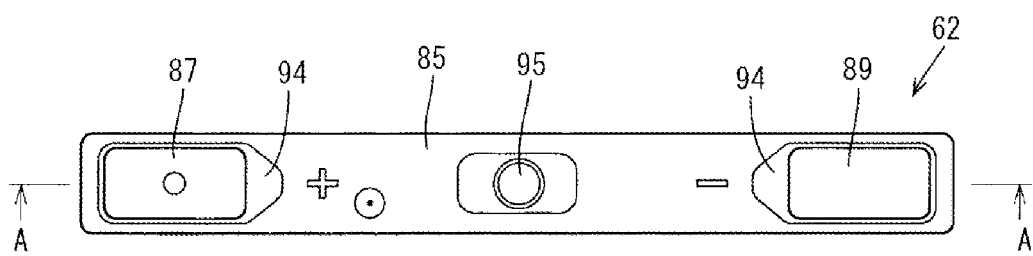
FIG. 2 is a plan view of a secondary battery.
Figure 3:
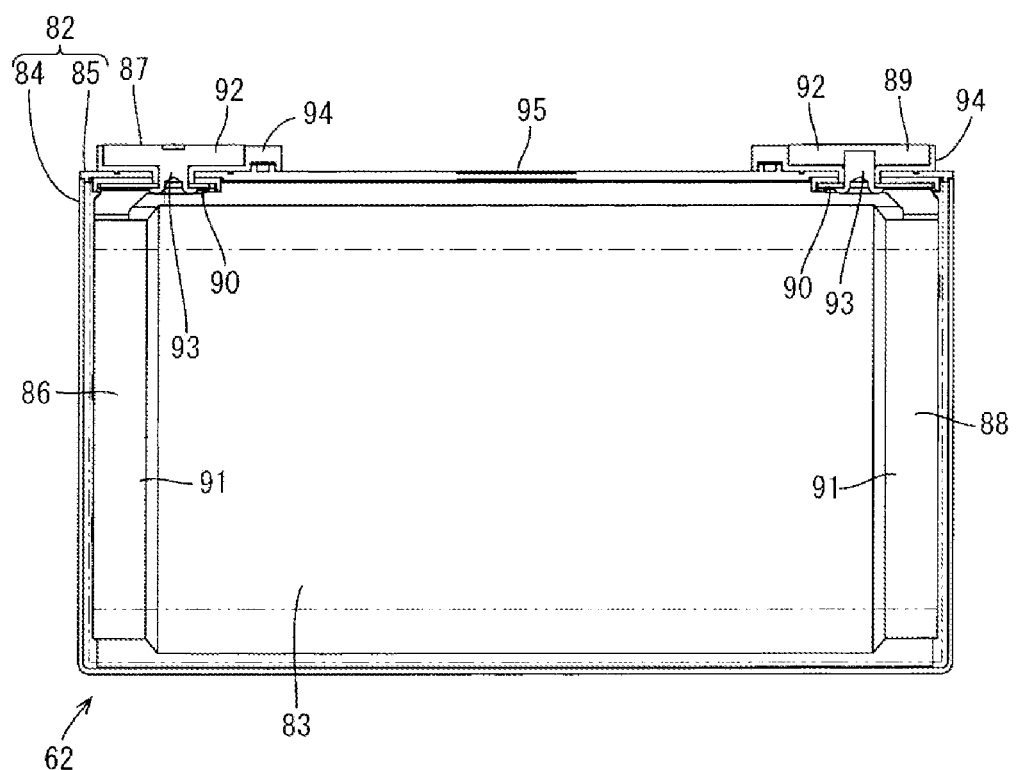
FIG. 3 is a cross-sectional view taken along line A-A of FIG. 2.

As shown in FIGS. 2 and 3, the battery cell 62 in the present embodiment is a prismatic cell in which an electrode assembly 83 is housed together with a nonaqueous electrolyte in a rectangular parallelepiped case 82. The case 82 includes a case body 84 and a lid 85 that closes an opening portion above the case body 84. Alternatively, the battery cell may be a pouch cell or a cylindrical cell.

Although not shown in detail, the electrode assembly 83 in the present embodiment is formed by disposing a porous resin film (separator) between a negative electrode element formed by applying an active material to a substrate made of a copper foil and a positive electrode element formed by applying an active material to a substrate made of an aluminum foil. These are all belt-shaped, and are wound in a flat shape so as to be able to be housed in the case body 84 in a state where the negative electrode element and the positive electrode element are displaced from each other on the opposite sides in the width direction with respect to the separator. Instead of the winding-type electrode assembly, a stacking-type electrode assembly may be used.

A positive electrode terminal 87 is connected to the positive electrode element via a positive electrode current collector 86, and a negative electrode terminal 89 is connected to the negative electrode element via a negative electrode current collector 88. Each of the positive electrode current collector 86 and the negative electrode current collector 88 includes a flat plate-shaped pedestal portion 90 and a leg portion 91 extending from the pedestal portion 90. A through hole is formed in the pedestal portion 90. The leg portion 91 is connected to the positive electrode element or the negative electrode element. Each of the positive electrode terminal 87 and the negative electrode terminal 89 includes a terminal body portion 92 and a shaft portion 93 protruding downward from a center portion of a lower surface of the terminal body portion. The terminal body portion 92 and the shaft portion 93 of the positive electrode terminal 87 are integrally formed of aluminum (single material). In the negative electrode terminal 89, the terminal body portion 92 is made of aluminum; the shaft portion 93 is made of copper; and these are assembled. The terminal body portions 92 of the positive electrode terminal 87 and the negative electrode terminal 89 are disposed at both end portions of the lid 85 via a gasket 94 made of an insulating material, and are exposed outward from the gasket 94.

The lid 85 includes a pressure release valve 95. As shown in FIG. 2, the pressure release valve 95 is located between the positive electrode terminal 87 and the negative electrode terminal 89. When the internal pressure of the case 82 exceeds the limit value, the pressure release valve 95 is released to lower the internal pressure of the case 82.

Figure 4:
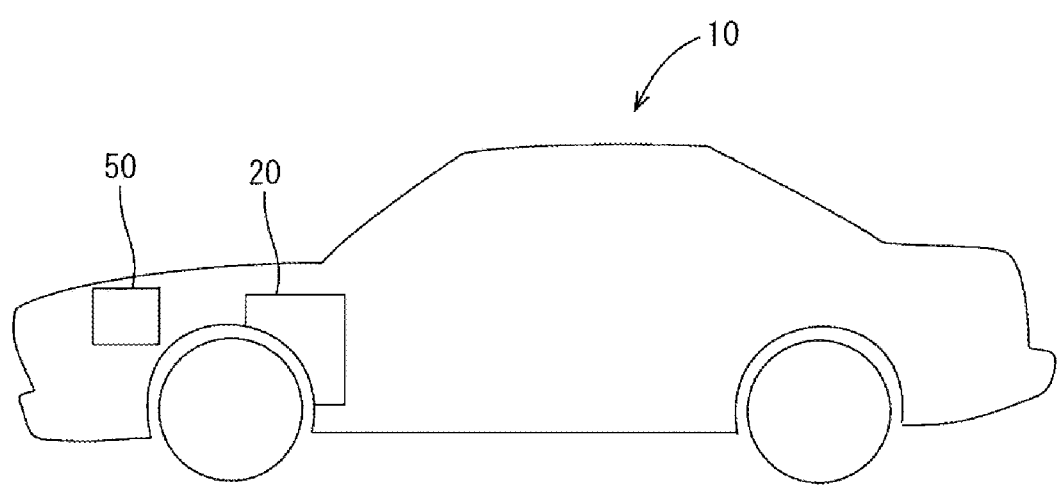
FIG. 4 is a side view of a four-wheeled automobile.

As shown in FIG. 4, the battery 50 can be used by being mounted on a four-wheeled automobile 10. The battery 50 may be used for starting an engine 20 that is a driving device of the four-wheeled vehicle 10, for supplying power to an auxiliary machine of the four-wheeled vehicle 10, or for backup for redundancy.

2. Electrical Configuration of Battery 50

Figure 5:
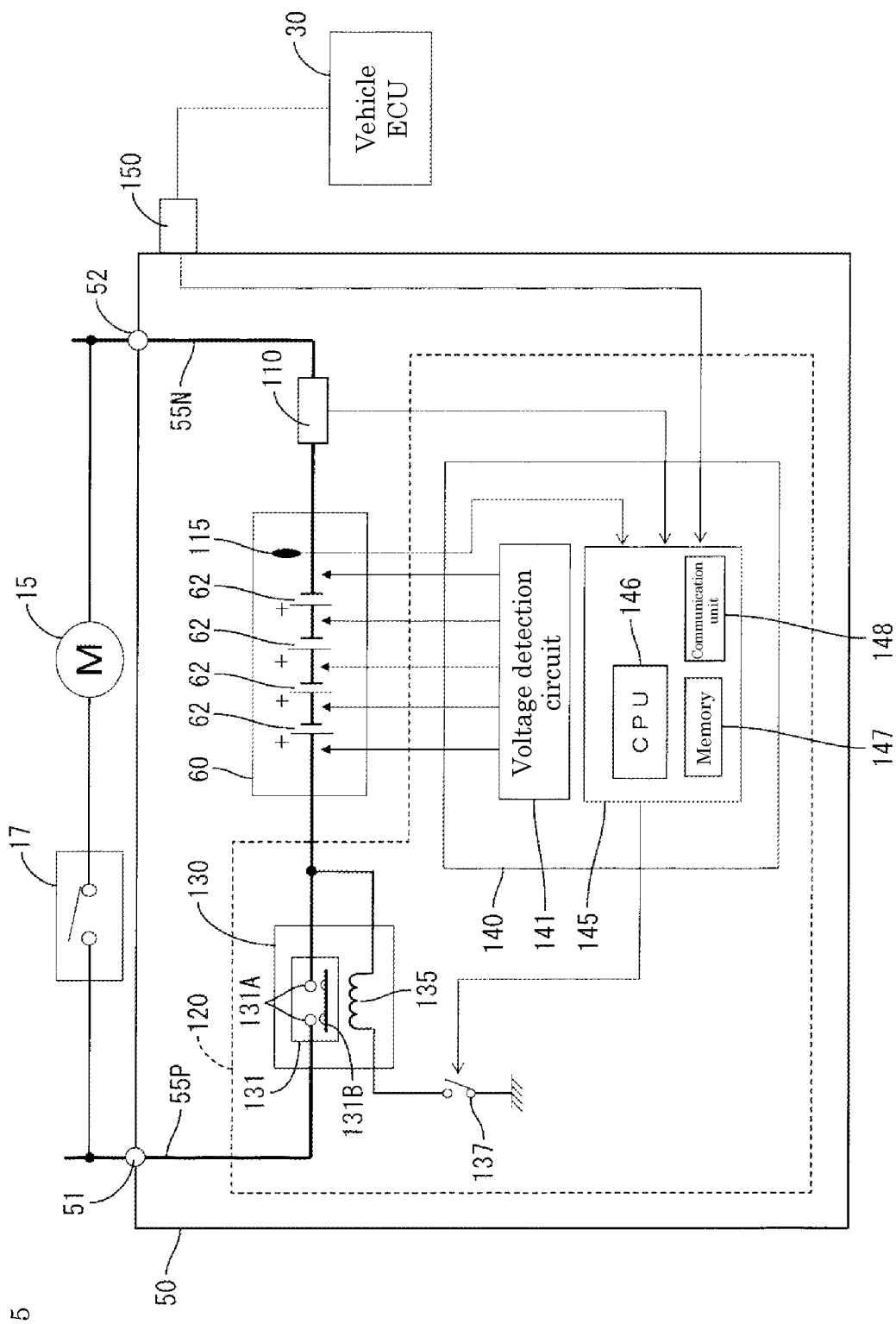
FIG. 5 is a block diagram of a battery.

FIG. 5 is a block diagram of the battery 50. A starter motor 15 for starting the engine 20 mounted on the four-wheeled automobile 10 and an IG switch 17 may be connected to the battery 50.

When the IG switch 17 is turned on, a current flows from the battery 50 to the starter motor 15, to drive the starter motor 15. The engine 20 can be started by driving the starter motor 15.

In addition to the starter motor 15, a vehicle load (not illustrated) such as an electrical component or an alternator (not illustrated) may be connected to the battery 50. When the power generation amount of the alternator is larger than the power consumption of the vehicle load, the battery 50 is charged by the alternator. When the power generation amount of the alternator is smaller than the power consumption of the vehicle load, the battery 50 is discharged to compensate for the shortage.

The battery 50 includes an assembled battery 60, a current sensor 110, a temperature sensor 115, and a protective device 120. The assembled battery 60 includes a plurality of battery cells 62 connected in series. The protective device 120 includes a relay 130 and a management device 140.

The assembled battery 60, the current sensor 110, and the relay 130 are connected in series via power lines 55P and 55N. The power lines 55P and 55 N are current paths of the assembled battery 60.

The power line 55P connects the external terminal 51 of the positive electrode and the positive electrode of the assembled battery 60 to each other. The power line 55N connects the external terminal 52 of the negative electrode and the negative electrode of the assembled battery 60 to each other.

The current sensor 110 is provided in the power line 55N. The current sensor 110 detects and outputs the current I of the assembled battery 60.

The relay 130 includes a contact 131 and a drive coil 135. The contact 131 is provided in the power line 55P. The contact 131 includes a fixed contact 131A and a movable contact 131B.

One end of the drive coil 135 is connected to the positive electrode of the assembled battery 60, and the other end is connected to the ground via a switch 137. The drive coil 135 can operate the movable contact 131B away from the fixed contact 131A or in the contact direction under the action of a magnetic force.

In this embodiment, the contact 131 is normally closed, and in a normal state, the movable contact 131B is controlled so as to be brought into contact with the fixed contact 131A by a spring force.

When the switch 137 is turned on to energize the drive coil 135, the movable contact 131B is separated from the fixed contact 131A by the action of the magnetic force, whereby the contact 131 can be brought into an OPEN state. When the switch 137 is turned off, the contact 131 automatically returns to a CLOSE state.

The management device 140 includes a voltage detection circuit 141 and a control device 145. The voltage detection circuit 141 detects the cell voltage V of each battery cell 62.

The control device 145 includes a CPU 146, a memory 147, and a communication unit 148. The CPU 146 monitors the cell voltage V of each battery cell 62 and the total voltage of the assembled battery 60 based on the output of the voltage detection circuit 141.

The CPU 146 monitors the current I of the battery 50 based on the output of the current sensor 110, and monitors the temperature T of the assembled battery 60 based on the output of the temperature sensor 115. The memory 147 stores various data for monitoring and controlling the battery 50.

The control device 145 has a control function of the relay 130, and turns on the switch 137 to switch the contact 131 from the CLOSE state to the OPEN state when the battery 50 has any abnormality of the following (a) to (c). The OPEN of the contact 131 can cut off the current I to protect the battery 50.

(a) the cell voltage V of the battery cell 62
(b) the current I of the battery 50
(c) the temperature T of the battery 50

The battery 50 includes a communication connector 150. The battery 50 is communicably connected to a vehicle ECU 30 via the communication connector 150. The management device 140 can receive operation information of the four-wheeled vehicle 10 and operation information of the engine 20 by communication from the vehicle ECU 30.

3. Reduction Processing of Resistance Loss and Contact Resistance in Relay

When the CLOSE of the contact 131 continues, the oxidized surface film is formed at a contact portion between the fixed contact 131A and the movable contact 131B, whereby the contact resistance increases. The oxidized surface film is broken by the current I equal to or larger than a predetermined value X, but is not broken by the current I less than the predetermined value. The predetermined value X is, for example, 100 mA.

The relay 130 is controlled to CLOSE at the normal time, whereby the contact 131 is maintained at CLOSE during parking if there is no abnormality. The current I discharged from the battery 50 during parking is a consumption of standby power of an electronic device or a security device, and is equal to or less than the predetermined value X. Therefore, when parking continues for a long period of time, the oxidized surface film of the contact 131 grows without being broken. This causes a problem that the contact resistance (hereinafter, relay resistance) of the relay 130 increases to causes an increase in the resistance loss of the relay 130.

Figure 6:
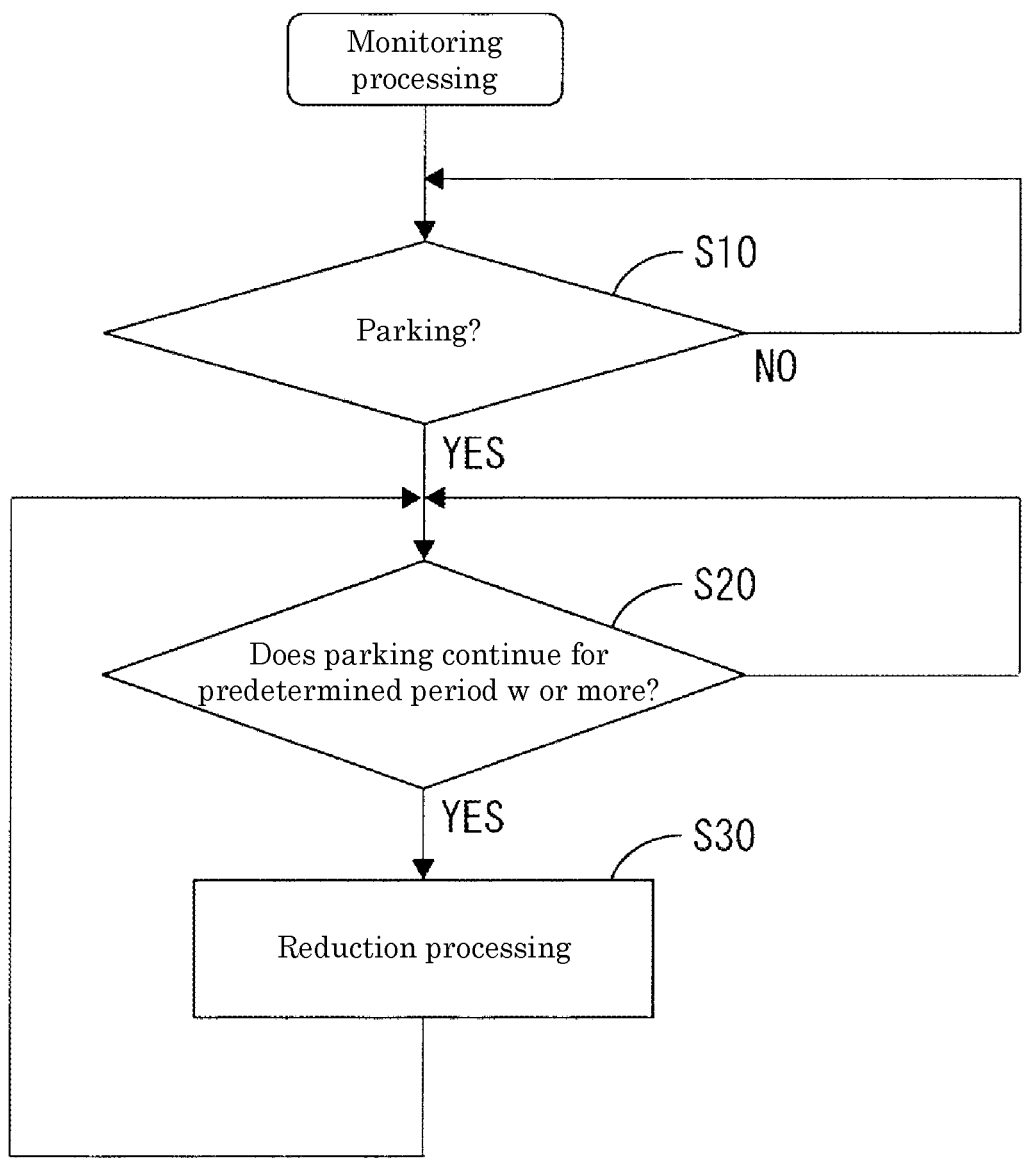
FIG. 6 is a flowchart of a monitoring processing.

FIG. 6 is a flowchart of a monitoring processing executed during parking. The monitoring processing includes three steps S10 to S30.

In S10, the control device 145 determines whether the four-wheeled vehicle 10 is parked. Parking is a state where at least the engine 20 is stopped and the vehicle does not move for a predetermined time.

During parking, the battery 50 is hardly discharged except for the standby power of the electronic device or the like. Therefore, the presence or absence of parking can be determined from the current I of the battery 50. For example, when a state where the current value of the battery 110 is equal to or less than a threshold value continues for a predetermined time or more, the four-wheeled vehicle 10 can be determined to be parked. The threshold value is, for example, 100 mA. The threshold value may be a value smaller than 100 mA.

In addition to the current I, for example, the presence or absence of parking may be determined based on whether communication with the vehicle ECU 30 is stopped for a predetermined time or more.

When the control device 145 determines that the vehicle is parked, the control device 145 determines whether parking continues for a predetermined period W or more in S20. The predetermined period W may be several months.

When parking continues for the predetermined period W or more, the control device 145 executes a reduction processing of reducing the relay resistance in S30. Specifically, the processing of opening and closing the contact 131 is successively performed a plurality of times.

Figure 7:
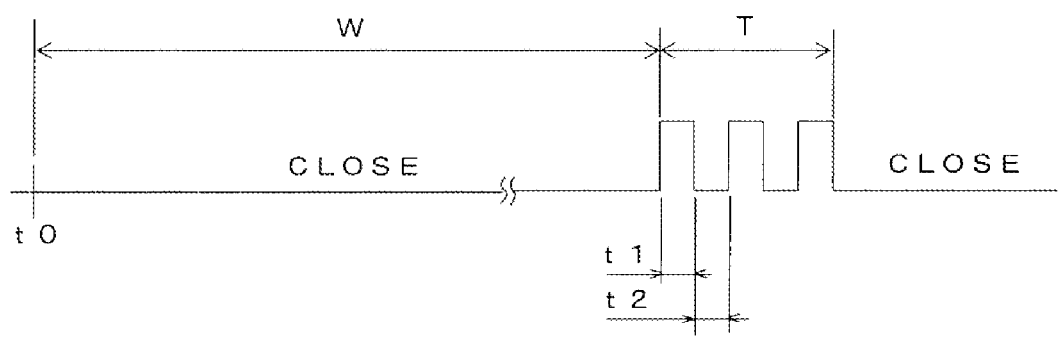
FIG. 7 is a diagram illustrating the state of a contact after parking is detected.

FIG. 7 is a diagram illustrating the state of the contact 131 after parking is detected. t0 is a time when parking is detected. The contact 131 is controlled to CLOSE for a predetermined period W after parking is detected.

A period T is an execution period of the reduction processing. t1 indicates the OPEN of the contact 131, and t2 indicates the CLOSE of the contact 131. In this example, the OPEN/CLOSE of the contact 131 is successively performed three times within the period T. The period T may be about several seconds to several tens of seconds.

By the CLOSE/OPEN of the contact 131, the oxidized surface film formed on the contact 131 can be broken to reduce the relay resistance.

Figure 8:
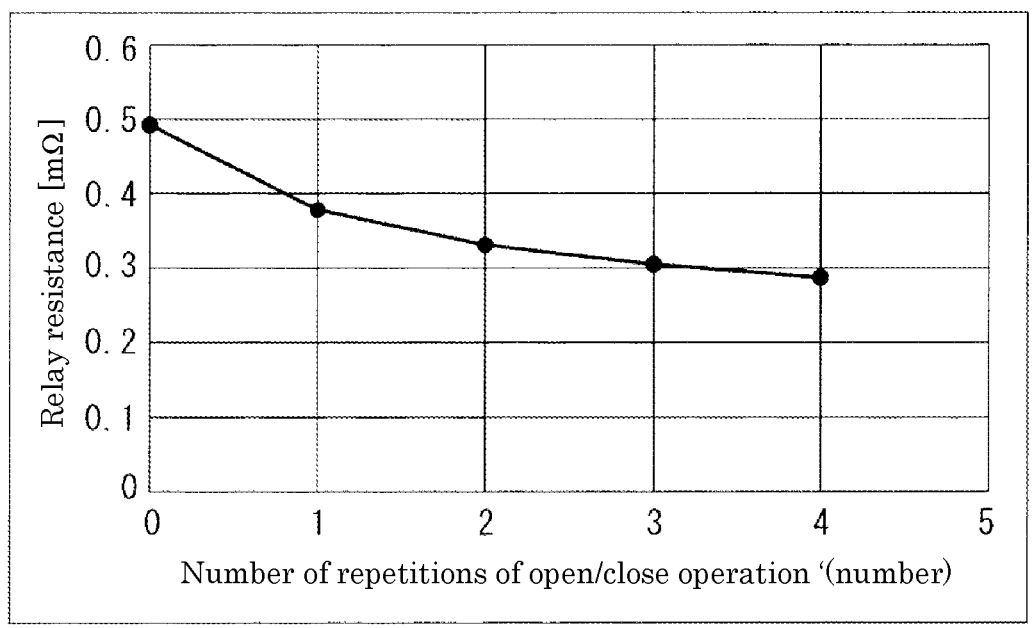
FIG. 8 is a diagram illustrating a change in a resistance in a relay.

FIG. 8 is a graph illustrating a relationship between the number of repetitions of open/close operation of the contact and the relay resistance. The relay resistance decreases as the number of repetitions of open/close operation of the contact 131 increases. The number of repetitions of open/close operation is preferably at least twice or more.

After the reduction processing is executed, the contact 131 is controlled to CLOSE, and when the predetermined period W elapses, the processing proceeds to S30 again to execute the reduction processing.

4. Description of Effects

By executing the reduction processing, the relay resistance can be reduced to suppress the resistance loss in the relay 130. When the battery 50 is used for engine startup, the resistance loss is suppressed, which makes it possible to suppress the occurrence of a problem that the engine 20 cannot be started under a condition where engine startability is deteriorated, such as a low temperature environment or a low SOC.

Second Embodiment

In the first embodiment, the relay resistance is reduced by the OPEN/CLOSE of the contact 131. The second embodiment is different from the first embodiment in the content of a relay resistance reduction processing.

In the second embodiment, when a predetermined period W has elapsed from parking detection, a control device 145 notifies a vehicle ECU 30 to request permission for discharge.

Upon receiving the notification of discharge for permission from a battery 50, the vehicle ECU 30 sends a command to consume power to a vehicle load 19 connected to the battery 50. The vehicle load 19 may be an electronic device such as a memory.

Figure 9:
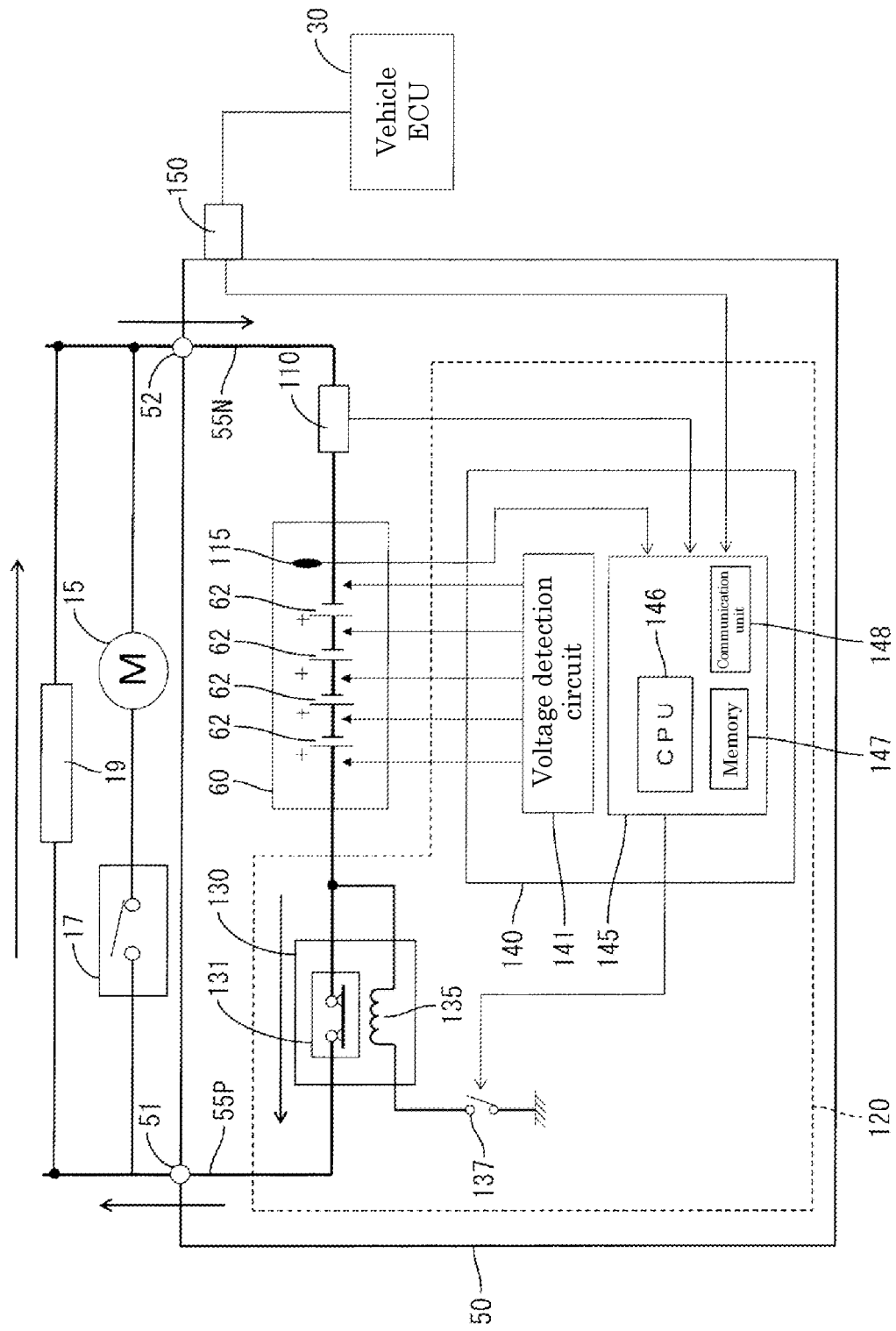
FIG. 9 is a block diagram of a battery.

The vehicle load 19 responds to the command and consumes power, whereby the battery 50 discharges a current equal to or larger than a predetermined value X (see FIG. 9). A discharge time may be about several seconds to several tens of seconds.

A current equal to or larger than the predetermined value X flows through the contact 131, whereby an oxidized surface film can be broken to reduce the relay resistance. The predetermined value X is a current value at which the oxidized surface film is broken, and is, for example, 100 mA. This method has an advantage that the relay resistance can be reduced without opening a current path.

Third Embodiment

Figure 10:
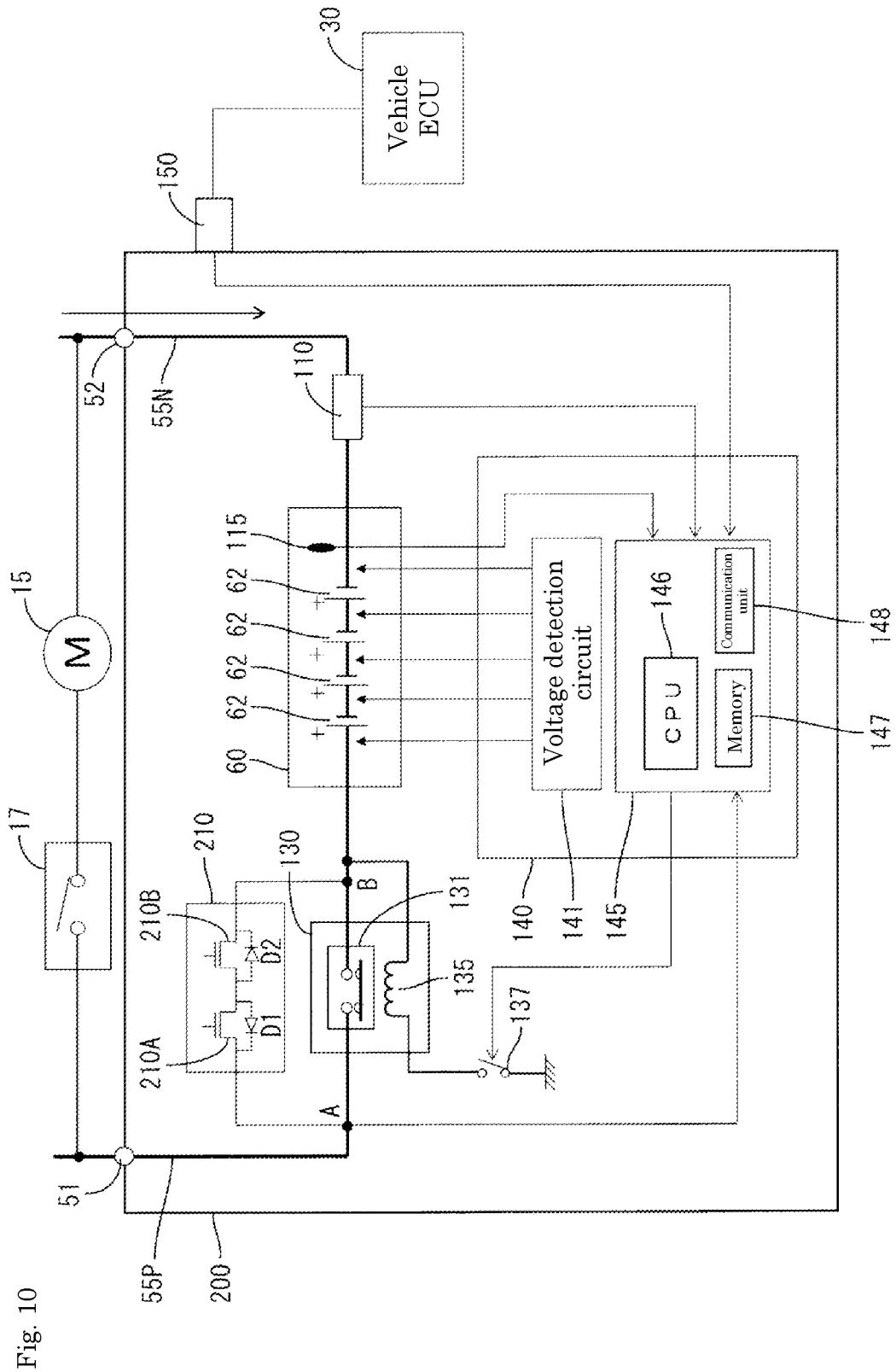
FIG. 10 is a block diagram of a battery.

FIG. 10 is a block diagram of a battery 200. The battery 200 is different from a battery 50 in that a bypass circuit 210 is provided. The bypass circuit 210 includes a first FET 210A and a second FET 210B connected in series.

The bypass circuit 210 is connected in parallel to a relay 130. Specifically, each of the first FET 210A and the second FET 210B is a P-channel, and the drains thereof are connected to each other. A source of the first FET 210A is connected to a point A on one side of the relay 130, and a source of the second FET 210B is connected to a point B on the other side. A parasitic diode D1 of the first FET 210A and a parasitic diode D2 of the second FET 210B are in opposite directions.

A control device 145 can detect the failure of the relay 130 using the bypass circuit 210. After a contact 131 of the relay 130 is switched from CLOSE to OPEN, the first FET 210A is turned off, the second FET 210B is turned on; and the voltage at the point A is detected by the control device 145.

When the relay 130 is normally operated (when the contact 131 is in an OPEN state), the voltage at the point A is lower than the voltage of the positive electrode of an assembled battery 60 (the voltage at the point B) by the voltage drop of the parasitic diode D1.

When the relay 130 has an abnormality (when the contact 131 is not in an OPEN state), the voltage at the point A has the same potential as that of the voltage of the positive electrode of the assembled battery 60 (the voltage at the point B). Therefore, the failure of the relay 130 can be detected based on the voltage at the point A.

The reduction processing of the first embodiment may be performed together with the failure detection of the relay 130. For example, the failure of the relay 130 may be detected at a predetermined timing after parking is detected, and when the relay 130 is normal, the relay 130 may be successively opened and closed to reduce the relay resistance.

Other Embodiments

The present invention is not limited to the embodiments described with reference to the above description and drawings, and for example, the following embodiments are also included in the technical scope of the present invention.

(1) In the first to third embodiments described above, the cell 62 is the secondary battery. The cell is not limited to the secondary battery, and may be a capacitor or another chargeable/dischargeable cell (energy storage device).

(2) In the first to third embodiments described above, the battery 50 is used for the four-wheeled vehicle. The battery 50 may be used for a motorcycle, and the use application of the battery 50 is not limited to a specific application. The battery 50 can be used for various applications such as a mobile object (for a vehicle, a ship, and an AGV and the like) and a stationary object (an energy storage apparatus of an uninterruptible power supply system or a solar power generating system).

(3) In the first to third embodiments described above, the reduction processing of reducing the relay resistance is executed when the predetermined period W has elapsed after the parking detection. The reduction processing may be performed at any time as long as the contact 131 is in the CLOSE state. Preferably, the processing may be executed when the current of the battery cell 62 is equal to or less than the predetermined value X and the CLOSE state of the contact 131 continues for the predetermined period W or more.

(4) In the first to third embodiment described above, parking is detected based on the current value of the battery 50. The detection of parking may be determined from the operation information of the vehicle transmitted from the vehicle ECU 30. The operation information of the vehicle may be the presence or absence of traveling, the operation state of the engine 20, or the operation state of the IG switch 17, or the like.

Figure 11:
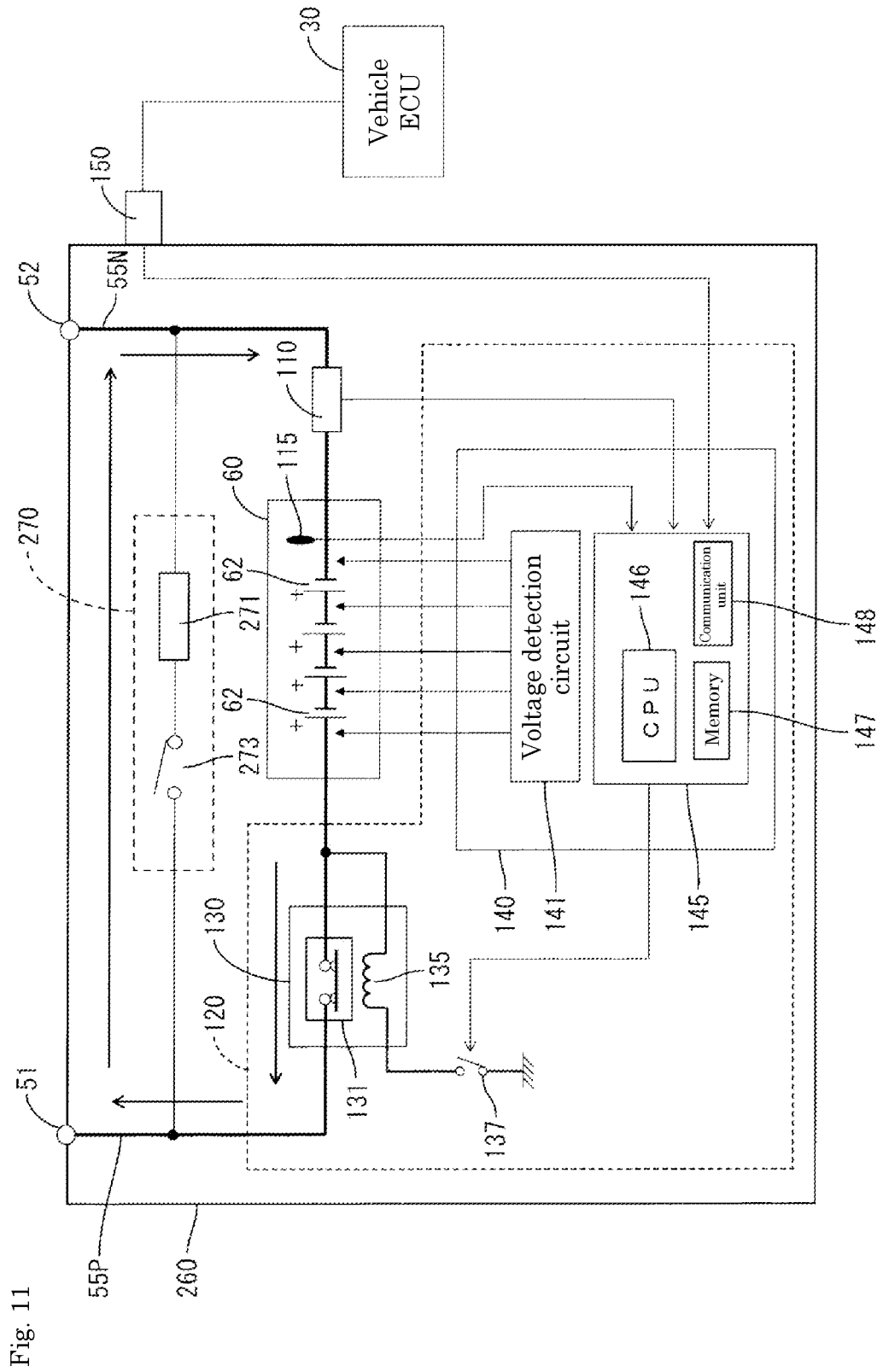
FIG. 11 is a block diagram of a battery.

(5) In the second embodiment described above, the relay resistance is reduced by discharging the current of the predetermined value X or more to the vehicle load 19. FIG. 11 is a block diagram of a battery 260. The battery 260 is different from a battery 50 in that an internal discharge circuit 270 is provided. The internal discharge circuit 270 includes a resistor 271 and a switch 273, and is connected between two external terminals 51 and 52. By switching the switch 273 from off to on and discharging a current of a predetermined value X or more in the internal discharge circuit 270, the relay resistance can be reduced.

DESCRIPTION OF REFERENCE SIGNS

50: battery (energy storage apparatus)
62: battery cell
120: protective device
130: relay
131: contact
135: drive coil
137: switch
145: control device

The invention claimed is:

1. A protective device comprising:
a relay including a contact that opens and closes a current path of a cell;
a bypass circuit connected in parallel to the relay; and
a control device that controls the relay and the bypass circuit,
wherein the control device executes a reduction processing of reducing a contact resistance of the relay, and
wherein the control device executes the reduction processing when a current of the cell is equal to or less than a predetermined value and a CLOSE state of the contact continues for a predetermined period.

2. The protective device according to claim 1, wherein the control device detects a failure of the relay using the bypass circuit.

3. The protective device according to claim 1, wherein the reduction processing comprises a processing of successively opening and closing the contact a plurality of times or a processing of energizing the relay.

4. The protective device according to claim 1, wherein the cell is used for a vehicle, and
the control device executes the reduction processing during parking.

5. The protective device according to claim 4, wherein the cell is used for engine startup.

6. An energy storage apparatus comprising:
a cell; and
the protective device according to claim 1.

7. The protective device according to claim 1, wherein when a parking of a vehicle is determined to continue for the predetermined period of time or more, the reduction processing is executed.

8. The protective device according to claim 1, wherein after the reduction processing is executed, the contact is controlled to the CLOSE state, and when the predetermined period elapses again after the contact is in the CLOSE state, the processing proceeds to repeat the reduction processing.

9. A method for reducing a contact resistance of a relay, the method comprising:
   detecting a failure of the relay using a bypass circuit connected in parallel to the relay located in a current path of a cell;
   opening and closing, or energizing the relay; and
   executing a reduction processing to reduce a contact resistance of the relay when a current of the cell is equal to or less than a predetermined value and a CLOSE state of the contact continues for a predetermined period.

10. The method according to claim 9, wherein the reduction processing comprises opening and closing the contact a plurality of times or energizing the relay.

11. The method according to claim 9, wherein the reduction processing is executed during parking of a vehicle.

12. The method according to claim 9, wherein the executing of the reduction processing is performed during engine startup of a vehicle.

13. A computer readable medium storing instructions comprising the method according to claim 9.

14. A protective device comprising:
   a relay including a contact that opens and closes a current path of a cell; and
   a control device that controls the relay,
   wherein the control device executes a reduction processing of reducing a contact resistance of the relay,
   wherein the control device executes the reduction processing when a current of the cell is equal to or less than a predetermined value.

15. The protective device according to claim 14, wherein the control device executes the reduction processing when the current of the cell is equal to or less than the predetermined value and a CLOSE state of the contact continues for a predetermined period.

16. The protective device according to claim 14, further comprising
   a bypass circuit connected in parallel to the relay, and
   wherein the control device controls the relay and the bypass circuit.

17. The protective device according to claim 16, wherein the control device detects a failure of the relay using the bypass circuit.

18. The protective device according to claim 14, wherein the reduction processing comprises a processing of successively opening and closing the contact a plurality of times or a processing of energizing the relay.

19. The protective device according to claim 14, wherein the cell is used for a vehicle, and
   the control device executes the reduction processing during parking.

20. An energy storage apparatus comprising:
   a cell; and
   the protective device according to claim 14.

* * * * *